(12) United States Patent
Unosawa

(10) Patent No.: US 8,766,294 B2
(45) Date of Patent: Jul. 1, 2014

(54) SEMICONDUCTOR LIGHT-EMITTING DEVICE AND METHOD OF FORMING THE SAME

(71) Applicant: Keisuke Unosawa, Kanagawa (JP)

(72) Inventor: Keisuke Unosawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/707,001

(22) Filed: Dec. 6, 2012

(65) Prior Publication Data

US 2013/0146933 A1 Jun. 13, 2013

(30) Foreign Application Priority Data

Dec. 7, 2011 (JP) ................................. 2011-268321
Sep. 28, 2012 (JP) ................................. 2012-218783

(51) Int. Cl.
*H01L 33/38* (2010.01)

(52) U.S. Cl.
USPC ........... 257/91; 257/E33.065; 438/28; 438/47

(58) Field of Classification Search
None
See application file for complete search history.

(56) References Cited

U.S. PATENT DOCUMENTS

| | | | | |
|---|---|---|---|---|
| 5,696,389 A | * | 12/1997 | Ishikawa et al. | 257/99 |
| 6,331,450 B1 | * | 12/2001 | Uemura | 438/114 |
| 8,110,421 B2 | * | 2/2012 | Sugizaki et al. | 438/26 |
| 8,445,916 B2 | * | 5/2013 | Kojima et al. | 257/76 |
| 2005/0156189 A1 | * | 7/2005 | Deguchi et al. | 257/103 |
| 2006/0113548 A1 | * | 6/2006 | Chen et al. | 257/79 |
| 2010/0163895 A1 | * | 7/2010 | Horie | 257/98 |
| 2010/0237381 A1 | * | 9/2010 | Kamiya | 257/99 |
| 2011/0027921 A1 | * | 2/2011 | Hamasaki et al. | 438/26 |
| 2011/0220931 A1 | * | 9/2011 | Kojima | 257/98 |
| 2011/0233585 A1 | * | 9/2011 | Kojima et al. | 257/98 |
| 2011/0297997 A1 | * | 12/2011 | Izuka et al. | 257/99 |
| 2013/0248915 A1 | * | 9/2013 | Shimada et al. | 257/99 |

FOREIGN PATENT DOCUMENTS

| | | |
|---|---|---|
| JP | 2000-244012 | 9/2000 |
| JP | 2011-258670 | 12/2011 |

* cited by examiner

*Primary Examiner* — Thomas L Dickey
*Assistant Examiner* — Joseph Schoenholtz
(74) *Attorney, Agent, or Firm* — Patterson & Sheridan, LLP

(57) ABSTRACT

A semiconductor light-emitting device has a first principal surface, a second principal surface formed on a side opposite to the first principal surface, and a light-emitting layer. A p-electrode on the second principal surface is in the region of the light-emitting layer and surrounds an n-electrode. An insulating layer on the side of the semiconductor layer surrounds the p- and the n-electrodes. A p-metal pillar creates an electrical connection for the p-electrode, and an n-metal pillar creates an electrical connection for the n-electrode. A resin layer surrounds the end portions of the p- and the n-metal pillars, and also covers the side surface of the semiconductor layer, the second principal surface, the p-electrode, the n-electrode, the insulating layer, the p-metal pillar and the n-metal pillar.

10 Claims, 9 Drawing Sheets

SEMICONDUCTOR LIGHT-EMITTING DEVICE AND METHOD OF FORMING THE SAME

CROSS-REFERENCE TO RELATED APPLICATION

This application is based upon and claims the benefit of priority from Japanese Patent Application No. 2011-268321, filed Dec. 7, 2011, and Japanese Patent Application No. 2012-218783, filed Sep. 28, 2012; the entire contents of both applications are incorporated herein by reference.

FIELD

Embodiments described herein relate to a semiconductor light-emitting device.

BACKGROUND

It is well known that there is a structure in which a p-electrode and an n-electrode are on one principal side of a semiconductor layer containing a light-emitting layer. In this structure, the electrodes do not impede output from the light-emitting surface, allowing for variable electrode shapes and layouts. However, there will be a more preferred, optimal design for them because the electrode shape and layout affect the electrical characteristics and the light-emitting efficiency.

DETAILED DESCRIPTION

The purpose of embodiments of the present disclosure is to provide a semiconductor light-emitting device with higher luminance.

In general, according to one embodiment, a semiconductor light-emitting device has layers which include: a semiconductor layer having a first principal surface, a second principal surface formed on a side opposite to the first principal surface, and a light-emitting layer; a p-electrode arranged on the second principal surface in a region of the light-emitting layer to surround an n-electrode arranged on the second principal surface; and an insulating layer arranged on side surfaces of the semiconductor layer and on the second principal surface of the semiconductor layer to surround the p-electrode and the n-electrode. A p-metal pillar creates an electrical connection for the p-electrode, and an n-metal pillar creates an electrical connection for the n-electrode. A resin layer surrounds the end portions of the p- and the n-metal pillars, and also covers the side surfaces of the semiconductor layer, the second principal surface, the p-electrode, the n-electrode, the insulating layer, the p-metal pillar and the n-metal pillar.

Embodiments will be explained with reference to figures, which all reference the same reference numbers throughout the following figures. In the figures illustrating the steps of operation, a portion of the wafer state is shown.

Example 1

Figure 1:
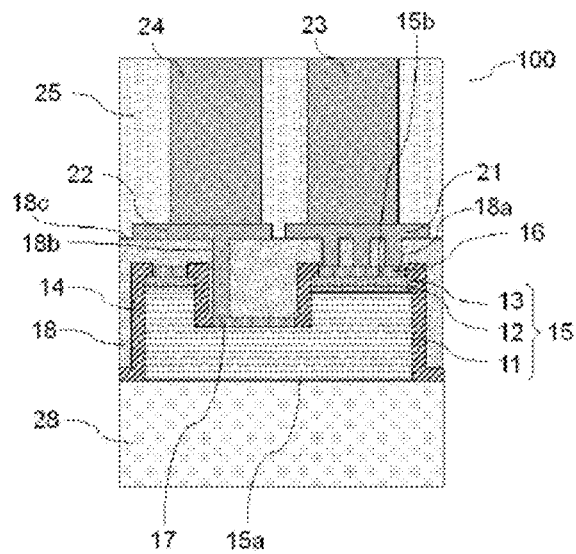
FIG. 1 is a schematic cross-sectional view illustrating a semiconductor light-emitting device according to a first embodiment.
Figure 2A:
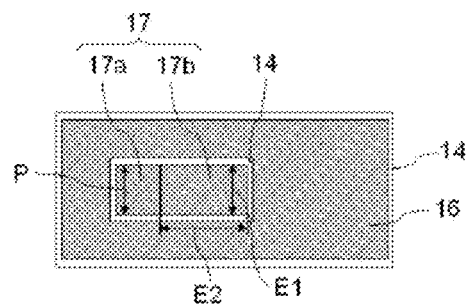
FIGS. 2A and 2B are schematic plane views illustrating shapes and layout of elements arranged on a second principal surface side of the semiconductor light-emitting device according to the first embodiment.
Figure 2B:
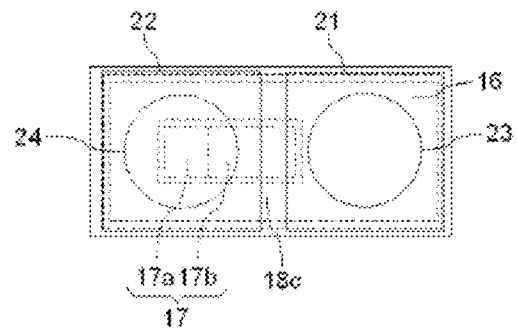

FIG. 1 is a schematic cross-sectional view illustrating a semiconductor light-emitting device 100 according to a first embodiment of the present disclosure. FIG. 2A is a schematic plane view illustrating an example of shapes and layout of a p-electrode (first electrode) 16 and an n-electrode (second electrode) in the semiconductor light-emitting device 100 of the first embodiment. FIG. 2B is a schematic plane view illustrating an example of the shapes and layout of a p-wiring layer 21, an n-wiring layer 22, a p-metal pillar 23, and an n-metal pillar 24 in the semiconductor light-emitting device 100 of the first embodiment.

The semiconductor light-emitting device 100 of the first embodiment has a semiconductor layer 15. The semiconductor layer 15 has a first principal surface 15a and a second principal surface 15b formed on the side opposite to the first principal surface. On the side of the second principal surface 15b, electrodes, a wiring layer, metal pillars, and a resin layer are formed. The light is primarily output from the first principal surface 15a.

The semiconductor layer 15 has a first semiconductor layer 11, a light-emitting layer (active layer) 12, and a second semiconductor layer 13. The first semiconductor layer 11 is an n-GaN layer that is a current path in a lateral direction. However, an electroconductive type of the first semiconductor layer 11 may be an n-type or a p-type. The light-emitting layer 12 is arranged to be sandwiched between the first semiconductor layer 11 and the second semiconductor layer 13, which is a p-GaN layer. However, the electroconductive type of the first semiconductor layer 11 may be a p-type or an n-type.

The side of the second principal surface 15b of the semiconductor layer 15 is embossed. The region protruding to the side opposite of the first principal surface 15a contains the light-emitting layer 12. A recession region dipping to the side of the first principal surface 15a with respect to the protrusion region does not contain the light-emitting layer 12 and the second semiconductor layer 13.

A p-electrode 16 is a first electrode on the second semiconductor layer 13 in the protrusion region (i.e., the p-electrode 16 is on the light-emitting region having the light-emitting layer 12). An n-electrode 17 is a second electrode on the first semiconductor layer 11 of the recession region.

While the p-electrode 16 and the n-electrode 17 occupy almost the entirety of the second principal surface, an area of the p-electrode 16 is larger than that of the n-electrode 17. The preferred design involves the area of the n-electrode 17 be 25% or less than the area of the p-electrode 16. By this configuration, the area of the light-emitting region of the p-electrode 16 is larger than the area of the non-light-emitting region of n-electrode 17, which allows for the possibility of increasing the luminance.

The p-electrode 16 and the n-electrode 17 may be made of copper (Cu), silver (Ag), or any metal associated with high electroconductivity. However, because the light emitted from the light-emitting layer 12 also reflects on the p-electrode 16 and the n-electrode 17, it is also preferred that these electrodes are made of a material associated with high reflectivity. With this composition, the efficiency of light output from the first principal surface 15a can be increased, thereby increasing the luminance.

As shown in FIG. 2A, the n-electrode 17 is surrounded by the p-electrode 16, and it has a first portion (pad portion) 17a and a second portion (branch portion) 17b.

The first portion 17a is a region connected to a second opening 18b where an n-wiring layer 22 shown in FIG. 1 is formed. In this embodiment, the first portion 17a is in quadrangle shape; however, the shape of the first portion is not limited to the quadrangle shape. Any appropriate shape may be adopted.

The second portion 17b is a region continuous to the first portion 17a. In this embodiment, it is rectangular, and the layout of the n-electrode 17 is such that the longitudinal side of the rectangular shape is set along the longitudinal direction of the semiconductor light-emitting device 100 in rectangular shape. Although the semiconductor light-emitting device 100 is rectangular shape in this embodiment, a scheme in which the semiconductor light-emitting device has a square shape may also be used.

A mean value of a length E1 (Eavg) of the second portion 17b in the lateral direction (i.e., a width of the second portion 17b) is represented by the following formula (1), where S represents an area of the second portion 17b, E2 represents a length from the edge connected with the first portion 17a to the end portion of the side opposite to the first portion 17a, and P represents a length of one edge of the first portion 17a (or a diameter when the shape is a curved surface).

$$E\text{avg}=S/E2\geq 0.3*P \quad (1)$$

On the other hand, a maximum length (Emax) of the length E1 of the second portion 17b in the lateral direction is represented by the following formula (2).

$$E\text{max}\geq 0.6*P \quad (2)$$

Consequently, as the second portion 17b is formed so that the average length Eavg of the second portion 17b in the lateral direction is 30% or more of the length of an edge or the diameter of the first portion 17a, it is possible to diffuse the current density distribution on the periphery of the first portion 17a to the second portion 17b. This configuration also can decrease heat generation. As a result, a higher current flow can be achieved, and emit light with a high luminance can be emitted.

In addition, the second portion 17b is formed so that its maximum length Emax in the lateral direction is 60% or more the length of an edge or the diameter of the first portion 17a. This configuration allows for the possibility of diffusing the density distribution of the first portion 17a to the second portion 17b, and it is possible to decrease heat generation. As a result, it is possible to have higher current flow, and it is thus possible to emit light at a higher luminance.

Figure 11:
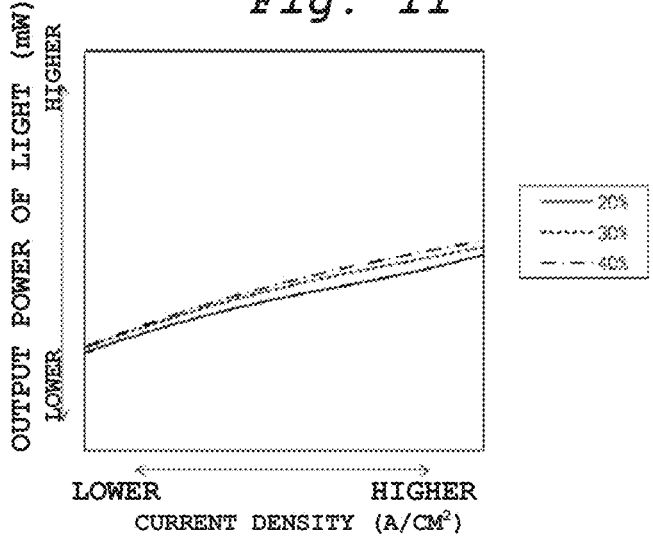
FIG. 11 is a graph illustrating a relationship between a current density and an output power of light according to the first embodiment.

FIG. 11 is a diagram illustrating the results obtained in the simulation of a relationship between a current density and an output power of light when the average length Eavg of the second portion 17b in the lateral direction is 20%, 30%, and 40% the length of an edge or the diameter of the first portion 17a, respectively.

When the average length Eavg of the second portion 17b in the lateral direction is 20% the length of an edge or the diameter of the first portion 17a, the output power of light is lower than that achieved when the average length is 30% and 40% the length of an edge or the diameter of the first portion. Additionally, when the current density is increased, the difference in the output power of light becomes greater i.e., the difference in the output power of light when the ratio is 20%, 30% and 40%, respectively, becomes greater.

Here, it can be seen that by adopting 30% or larger for the average length, it is possible to realize an effect in suppressing increase in the current density distribution on the periphery of the first portion 17a of the n-electrode 17 can be suppressed. As a result, the current density distribution to the second portion 17b can be diffused, thereby decreasing heat generation. As a result, the loaded current can be increased to obtain a higher output power of light. That is, by adopting the average length to be 30% or greater, it is possible to emit the light at a high luminance.

Figure 12:
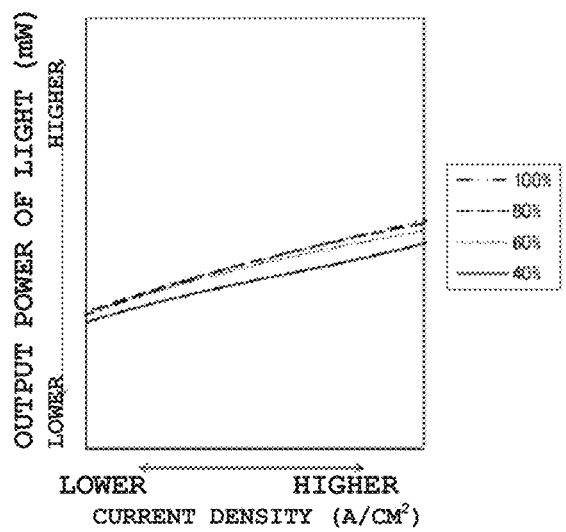
FIG. 12 is a graph illustrating the relationship between the current density and the output power of light according to the first embodiment.

FIG. 12 is a diagram illustrating the results obtained in the simulation of the relationship between the current density and the output power of light when the maximum length Emax of the second portion 17b in the lateral direction is 40%, 60%, 80%, and 100% the length of an edge or the diameter of the first portion 17a, respectively.

When the second portion 17b is formed so that its maximum length Emax of the second portion 17b in the lateral direction is 40% the length of an edge or the diameter of the first portion 17a, it can be seen that the output power of light is lower than that achieved when the ratio is 60%, 80%, and 100%. Additionally, as the current density increases, the difference in the output power of light between that with ratio of 40% and those with ratio of 60%, 80%, and 100% becomes greater.

When the ratio is 60%, 80%, or 100%, the difference in output power of light is not so great. Consequently, one can say that by selecting the ratio at 60% or larger, the current density distribution on the periphery of the first portion 17a of the n-electrode 17 can be suppressed. In addition, the current density distribution to the second portion 17b can be diffused, which reduces heat generation. This allows for more current to be loaded, a higher output power of light to be achieved, and light to be emitted with a higher luminance.

An insulating layer 14 is arranged between the n-electrode 17 and the p-electrode 16. A step is formed between the light-emitting region of the p-electrode 16 and the non-light-emitting region of the n-electrode 17. This step is covered by the insulating layer 14.

The insulating layer 14 is applied on the side surface of the semiconductor layer 15 and on the second principal surface to surround the p-electrode 16 and n-electrode 17. While the insulating layer 14 may be made of a silicon oxide. However, its material is not limited to the silicon oxide. It can also be made of other materials with insulating properties may also be used.

A first resin layer 18 is arranged to cover a portion of the insulating layer 14, the p-electrode 16, and the n-electrode 17. On the first resin layer 18, a first openings 18a are formed to generate electric connection between the p-electrode 16 and p-wiring layer 21. According to the present embodiment, plural first openings 18a are formed; however, the process can progress if at least one first opening is formed. However, the heat quantity generated by the p-electrode 16 on the light-emitting region having the light-emitting layer 12 is greater than that generated by the n-electrode 17 on the non-light-emitting region that does not contain the light-emitting layer 12. According to the present embodiment, plural first openings 18a are formed to guarantee a heat dissipation path from the p-electrode 16 to the p-wiring layer 21. As a result, the heat dissipation property is excellent, and the reliability and longevity can be improved.

On the first resin layer 18, the second opening 18b for connecting the n-electrode 17 with the n-wiring layer 22 with each other is formed. In this embodiment, a single second opening is formed, but plural openings may also be formed. However, as the heat quantity generated by the n-electrode 17 is less than that generated by the p-electrode 16, one second opening is sufficient.

Consequently, the area for connecting between the p-electrode 16 and the p-wiring layer 21 via the first openings 18a may be arranged to be larger than the area for connecting the n-electrode 17 with the n-wiring layer 22 with each other via the second opening 18b.

The light-emitting region provided with the p-electrode 16 protrudes from the portion of the n-electrode 17. Consequently, the space between the p-electrode 16 and the p-wiring layer 21 is less than the space between the n-electrode 17 and the n-wiring layer 22. In other words, a depth of the first openings 18a (going from the outer surface 18c of the first resin layer 18 to the p-electrode 16) is shallower than a depth of the second opening 18b (going from the outer surface 18c of the first resin layer 18 to the n-electrode 17). Consequently, the heat dissipation path is shorter and the heat dissipation efficiency is higher on the p-via the first openings 18a than the heat dissipation path and heat dissipation efficiency on the n-type via the second opening 18b.

This allows for the material of the first resin layer 18 to be polyimide or similar resin with excellent patterning property for fine openings. In addition, any insulating material, such as silicon oxide, may be used.

The p-wiring layer 21 are formed on the first resin layer 18 as the first wiring layer and the n-wiring layer 22 are formed on the first resin layer 18 as the second wiring layer, i.e., on the outer surface 18c on the side opposite to the side where the semiconductor layer 15 is arranged.

The p-wiring layer 21 is in the first openings 18a formed on the first resin layer 18 to reach and be electrically connected to the p-electrode 16, and it is electrically connected to the p-electrode 16. On the other hand, the n-wiring layer 22 is in the second opening 18b formed on the first resin layer 18 to reach the n-electrode 17, and it is electrically connected to the n-electrode 17.

As a first metal pillar, the p-metal pillar 23 is arranged on the p-wiring layer 21. As a second metal pillar, the n-metal pillar 24 is arranged on the n-wiring layer 22. That is, the first semiconductor layer 11 is in a state where it is electrically connected to the n-metal pillar 24 via the n-electrode 17 and the n-wiring layer 22. Then, the second semiconductor layer 13 is in a state where it is electrically connected to the p-metal pillar 23 via the p-electrode 16 and the p-wiring layer 21.

The p-metal pillar 23 and the n-metal pillar 24 have their end portions processed to have a surface treatment film for preventing the formation of rust or the like (such as Ni, Au, or other electroless plating film, precoated solder, or the like). For example, the following scheme may be adopted: via a ball- or bump-shaped external terminal made of solder or other metal material, jointing is carried out to the wiring formed on the assembly substrate or wiring plate. As a result, electric power can be fed to the semiconductor light-emitting device.

The thicknesses of the p-metal pillar 23 and the n-metal pillar 24 (i.e., the thicknesses from the upper side of the p-wiring layer 21 and the n-wiring layer 22 to the end portion of the p-metal pillar 23 and n-metal pillar 24, respectively) are thicker than the thicknesses of the following: the laminate containing the semiconductor layer 15; the n-electrode 17; the p-electrode 16; the insulating layers 14 and 18; the n-wiring layer 22; and the p-wiring layer 21 (i.e., the thickness from the surfaces of the p-wiring layer 21 and the n-wiring layer 22 in contact with the p-metal pillar 23 and the n-metal pillar 24 to the first principal surface of the semiconductor layer 15).

With the relationship of thicknesses, even when the semiconductor layer 15 is thin, it is still possible to guarantee the mechanical strength by increasing the thicknesses of the p-metal pillar 23, the n-metal pillar 24, and the second resin layer 25. Additionally, when the substrate is assembled, the stress applied via the external terminals on the semiconductor layer 15 can be relaxed, as the stress is absorbed by the n-metal pillar 24 and the p-metal pillar 23.

According to the present embodiment, the thicknesses of the p-metal pillar 23 and the n-metal pillar 24 are selected to be thicker than the thicknesses of the following: the laminate containing the semiconductor layer 15; the n-electrode 17; the p-electrode 16; the insulating layers 14 and 18; the n-wiring layer 22; and the p-wiring layer 21. However, the present disclosure is not limited to this scheme; it may also be designed with thinner components.

The area of contact between the n-wiring layer 22 and the n-metal pillar 24 is designed to be greater than the area of contact between the n-wiring layer 22 and the n-electrode 17. As a result, while a higher output power of light is emitted by a larger light emitting layer 12, it is possible to form the electrode larger for lead-out via the n-wiring layer 22 from the n-electrode 17 arranged with a small area for the portion of the semiconductor layer 15 that does not contain the light-emitting layer 12. Consequently, the semiconductor light-emitting device 100 can be easily assembled, and it is possible to dissipate the heat generated by the semiconductor layer 15 with a high efficiency.

The area of the contact between the p-wiring layer 21 and the p-metal pillar 23 is designed to be larger than the area of contact between the p-wiring layer 21 and the p-electrode 16. However, the present disclosure is not limited to this scheme. One may also adopt as a scheme in which the area of the contact between the p-wiring layer 21 and the p-metal pillar 23 is smaller than the area of the contact between the p-wiring layer 21 and the p-electrode 16.

The materials for making the p-wiring layer 21, the n-wiring layer 22, the p-metal pillar 23, and the n-metal pillar 24 include copper, gold, nickel, silver, etc. Among them, copper is preferred as it has high resistance to migration and excellent adherence with the insulating material.

The second resin layer 25 is arranged on the first resin layer 18 and surrounds the end portions of the p-metal pillar 23 and the n-metal pillar 24. It is arranged to cover the p-wiring layer 21 and the n-wiring layer 22. That is, the end portions (the upper surface as shown in FIG. 1) of the p-metal pillar 23 and the n-metal pillar 24 are exposed from the second resin layer 25.

The second resin layer 25 can be formed thick and at a low cost. Here, the preferred design requires the second resin layer to be made of a resin appropriate for reinforcing the n-metal pillar 24 and the p-metal pillar 23. For example, epoxy resin, silicone resin, fluororesin, etc. may be adopted. However, the second resin layer 25 may be made of the same material as the first resin layer 18.

A phosphor layer 28 is on the first principal surface 15a of the semiconductor layer 15. The phosphor layer 28 can absorb the light from the light-emitting layer 12 and emits the light with converted wavelength. Consequently, it is possible to emit a mixed light, including the light from the light-emitting layer 12 and the wavelength-converted light from the phosphor layer 28. For example, when the light-emitting layer 12 is made of a nitride-type material, it is possible to obtain white light or incandescent-light-bulb color light emitted due to the mixture of the blue light from the light-emitting layer 12 and the wavelength-converted light in yellow color obtained by the phosphor layer 28. In addition to yellow phosphor, the phosphor layer 28 may have a constitution containing plural types of phosphors (such as a red phosphor and green phosphor).

Examples of the phosphor layers that can be used as the phosphor layer 28 include the following a red phosphor layer, a yellow phosphor layer, a green phosphor layer, and a blue phosphor layer.

Examples of the red phosphor layers include those containing the nitride-type phosphor (CaAlSiN3:Eu) and sialon-type phosphor (silicon aluminum oxynitride).

With the sialon phosphor (silicon aluminum oxynitride) is utilized, in particular, the following type is preferred:

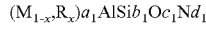

$(M_{1-x}, R_x)a_1 AlSib_1 Oc_1 Nd_1$ (where, M represents at least one type of metal element excluding Si and Al, or preferably at least one of Ca and Sr; R represents the light-emitting center element, or preferably Eu; x, $a_1$, $b_1$, $c_1$, $d_1$ meet the following relationship: $0<x\leq1$; $0.6<a_1\leq0.95$; $2<b_1\leq3.9$; $0.25<c_1\leq0.45$; $4<d_1\geq5.7$).

By using the sialon-type phosphor (silicon aluminum oxynitride) represented by the formula (1), improvements to the temperature characteristics of the wavelength conversion efficiency can be achieved, and it is possible to further increase the efficiency in the high current density region.

For example, the yellow phosphor layer may contain the silicate-type phosphor (Sr, Ca, Ba) $2SiO_4$:Eu.

For example, the green phosohor layer may contain the halophosphate-type phosphor (Ba, Ca, Mg)$_{10}$(PO$_4$)$_6$ C$_{12}$:Eu or sialon-type phosphor (silicon aluminum oxynitride).

With the sialon-type phosphor (silicon aluminum oxynitride), in particular, the following type is preferred:

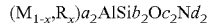

$(M_{1-x}, R_x)a_2 AlSib_2 Oc_2 Nd_2$ (where, M represents at least one type of metal element excluding Si and Al, or preferably at least one of Ca and Sr; R represents the light-emitting center element, or preferably Eu; x, a2, b2, c2, d2 meet the following relationship: $0<x\leq1$; $0.93<a_2\leq1.3$; $4.0<b_2\leq5.8$; $0.6<c_2\leq1$; $6<d_2\leq11$).

By using the sialon-type phosphor (silicon aluminum oxynitride) represented by the formula (2), it is possible to improve the temperature characteristics of the wavelength conversion efficiency, and further increases to the efficiency in the high current density region can be achieved.

For example, the blue phosphor layer may contain the oxide-type phosphor: BaMgAl$_{10}$O$_{17}$:Eu.

The light, emitted from the light-emitting layer 12 mainly goes through the first semiconductor layer 11, the first principal surface 15a, and the phosphor layer 28 before being emitted outwards.

Because electrodes are on the first principal surface 15a as the light-emitting surface, light emission is not hampered by the electrodes, and a high luminance can be obtained. The p-electrode 16 and the n-electrode 17 are on the first principal surface on the side opposite to the first principal surface 15a. Because the p-electrode 16 and the n-electrode 17 are not arranged on the light-emitting surface, one has a high freedom in selecting their shapes and layout.

In the embodiment, the electrodes are designed to have a higher light-emitting efficiency and a greater luminance. As shown in FIG. 2A, for the n-electrode 17, the first portion 17a and the second portion 17b are surrounded by the p-electrode 16. Then, the second portion 17b lies along the longitudinal direction of the p-electrode 16 (the longitudinal direction of the semiconductor light-emitting device 100), and the average length Eavg of the second portion 17b in the lateral direction is formed to be 30% or greater than the length of an edge or the diameter of the first portion 17a. As a result, it is possible to diffuse the current density distribution on the periphery of the first portion 17a to the second portion 17b. This layout allows for the diffusion the current density distribution on the periphery of the first portion 17a of the n-electrode 17 to the second portion 17b. As a result, it is possible to realize a high-efficiency semiconductor light-emitting device with the current density decreasing in the face direction of the light-emitting layer 12.

In addition, the maximum length Emax of the second portion 17b in the lateral direction of the second portion 17b is formed to be 60% or greater than the length of an edge or the diameter of the first portion 17a; this allows for further diffusion of the density distribution on the periphery of the first portion 17a to the second portion 17b, which can decrease heat generation.

In the following, a manufacturing method of the semiconductor light-emitting device related to the embodiment will be explained with reference to FIGS. 3A to 6C.

Figure 3A:
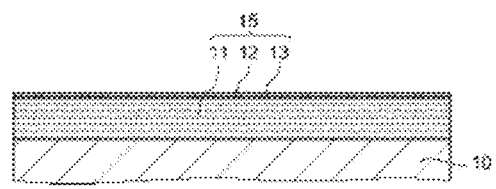
FIGS. 3A to 3C are schematic cross-sectional views illustrating a manufacturing method of the semiconductor light-emitting device according to the first embodiment.

First of all, as shown in FIG. 3A, the first semiconductor layer 11 is formed on a principal surface of a substrate 10 (e.g., of a memory cell array), and the second semiconductor layer 13 and the light-emitting layer 12 are formed on the first semiconductor layer. When these semiconductor layers that make up the semiconductor layer 15 are made of a nitride-type semiconductor, for example, they may be formed by crystal growth on a sapphire substrate or a silicon substrate.

Figure 3B:
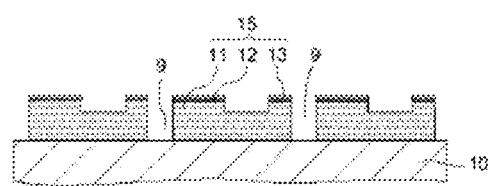
Figure 3C:
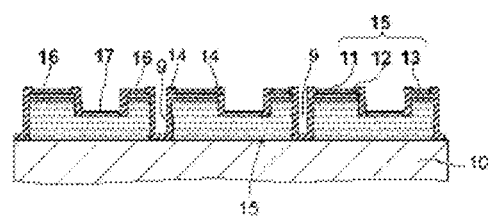

Next, FIG. 3B depicts how separating trenches 9 are formed through the semiconductor layer 15 to reach the substrate 10 (e.g., via the RIE (reactive ion etching) method using a resist not shown in the figure). The separating trenches 9 are formed in a lattice configuration on the substrate 10 while the substrate 10 is in a wafer state, to separate the semiconductor layer 15 into plural portions.

Then, with the RIE method using a resist not shown in the figure, a portion of the second semiconductor layer 13 and the light-emitting layer 12 is removed so that a portion of the first semiconductor layer 11 is exposed. As a result, on the side of the second principal surface 15b of the semiconductor layer 15, a light-emitting region located in an upper section as viewed from the substrate 10 and a non-light-emitting region located in a lower section nearer the substrate 10 than the light-emitting region are formed. The light-emitting region contains the light-emitting layer 12, and the non-light-emitting region does not contain the light-emitting layer 12.

FIG. 30 shows the next step, namely how the principal surface of the substrate 10, the side surfaces of the semiconductor layer 15, and the second principal surface 15b of the semiconductor layer 15 are covered by the insulating layer 14. This insulating layer 14 is then selectively removed to allow the p-electrode 16 to be formed on the surface of the light-emitting region (i.e., the surface of the second semiconductor layer 13) and the n-electrode 17 to be formed on the surface of the non-light-emitting region (i.e., the surface of the first semiconductor layer 11). Either the p-electrode 16 or the n-electrode 17 may be formed first; alternately, the p-electrode 16 and the n-electrode 17 can be formed using the same material at the same time.

Figure 4A:
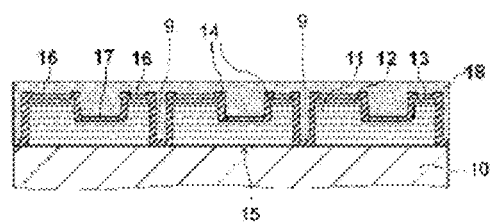
FIGS. 4A to 4C are schematic cross-sectional views illustrating the manufacturing method of the semiconductor light-emitting device according to the first embodiment.

The next step, as shown in FIG. 4A, involves covering the entirety of the portion exposed on the substrate 10 by the first resin layer 18. The first resin layer 18 also fills in the separating trenches 9.

Figure 4B:
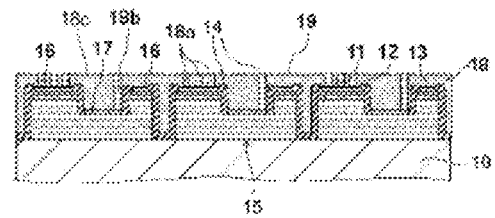

Then, as shown in FIG. 4B, the pattern of the first resin layer 18 is formed, e.g., by wet etching, to form the first openings 18a and the second opening 18b selectively in the first resin layer 18. Plural first openings 18a are formed to reach the p-electrode 16. The second opening 18b is formed to reach the n-electrode 17. The depth from an outer surface 18c of the first resin layer 18 of the second opening 18b is greater than that of the first openings 18a.

In the next step of the manufacturing process, a seed metal 19 (indicated by broken line in FIG. 4B) is formed continuously on the outer surface 18c of the first resin layer 18 and the inner surfaces of the first openings 18a and the second opening 18b. In addition, a resist is formed selectively on the seed metal 19.

Figure 4C:
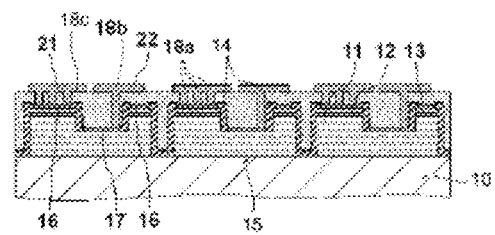

Then, Cu electroplating is carried out with the seed metal 19 as the current path. As a result, as shown in FIG. 4C, on the outer surface 18c of the first resin layer 18, the p-wiring layer 21 and the n-wiring layer 22 are formed selectively. The p-wiring layer 21 is formed inside the first openings 18a, and it is connected to the p-electrode 16. The n-wiring layer 22 is formed in the second opening 18b, and it is connected to the n-electrode 17. The p-wiring layer 21 and the n-wiring layer 22 are formed simultaneously using the Cu electroplating method. However, it is not a necessity to form the p-wiring layer 21 and the n-wiring layer 22 at the same time; either of them may be formed first.

At the n-wiring layer 22, the surface on the side opposite to the n-electrode 17 is larger than that of the surface contacting the n-electrode 17, and it is formed in a pad shape on the outer surface 18c of the first resin layer 18. Similarly, at the p-wiring layer 21, the surface on the side opposite to the p-electrode 16 is larger than the surface contacting the p-electrode 16, and it is formed in a pad shape on the outer surface 18c of the first resin layer 18.

Figure 5A:
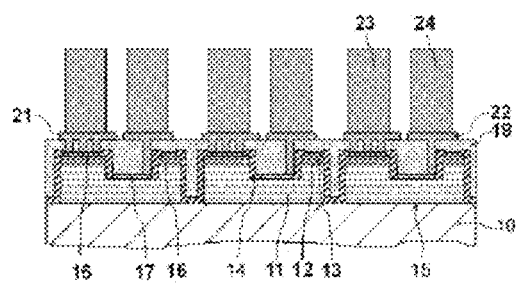
FIGS. 5A and 5B are schematic cross-sectional views illustrating the manufacturing method of the semiconductor light-emitting device according to the first embodiment.

In the next step depicted in FIG. 5A, another resist (not shown in the figure) for constructing metal pillars is selectively formed on the first resin layer 18, and, by Cu electroplating with the seed metal 19 as the current path, the p-metal pillar 23 is formed on the p-wiring layer 21, and the n-metal pillar 24 is formed on the n-wiring layer 22. The p-metal pillar 23 and the n-metal pillar 24 are simultaneously formed using the Cu electroplating method. However, it is not a necessity to form the p-metal pillar 23 and the n-metal pillar 24 simultaneously. Either of them may be formed first.

Figure 5B:
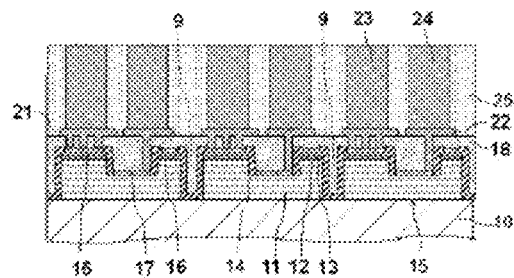

After the plating, the p-wiring layer 21, the n-wiring layer 22, the p-metal pillar 23, and the n-metal pillar 24 are used as a mask to carry out wet etching of the seed metal 19 exposed on the outer surface 18c of the first resin layer 18 (as shown in FIG. 5B). As a result, the electrical connection between the p-wiring layer 21 and the n-wiring layer 22 via the seed metal 19 is cut off.

Next, the second resin layer 25 is formed on the first resin layer 18. The second resin layer 25 covers the p-wiring layer 21, the n-wiring layer 22, the p-metal pillar 23, and the n-metal pillar 24. The second resin layer 25 fills the area between the side surfaces of the p-metal pillar 23 and the side surfaces of the n-metal pillar 24 and the area between the p-wiring layer 21 and the n-wiring layer 22.

Once this has been completed, the second resin layer 25 is ground, so that the upper surfaces of the p-metal pillar 23 and the n-metal pillar 24 (i.e., the surfaces on the side opposite to the first resin layer 18) are exposed through the second resin layer 25. Alternatively, the following scheme may also be adopted: after formation of the phosphor layer 28 (to be explained later), the second resin layer 25 is ground, and the upper surfaces of the p-metal pillar 23 and the n-metal pillar 24 are exposed.

Figure 6A:
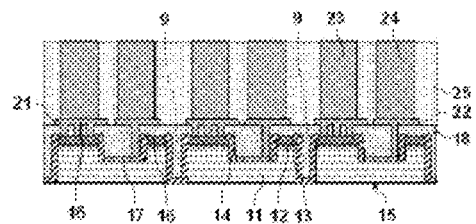
FIGS. 6A to 6C are schematic cross-sectional views illustrating the manufacturing method of the semiconductor light-emitting device according to the first embodiment.

Subsequently, as shown in FIG. 6A, the substrate 10 is removed by an appropriate method. For example, the substrate 10 may be removed using the laser liftoff method or by etching. More specifically, when the substrate 10 is light-transmissive, a laser beam is irradiated from the inner surface side of the substrate 10 towards the first semiconductor layer 11. As the laser beam reaches the interface between the substrate 10 and the first semiconductor layer 11, the first semiconductor layer 11 near the interface absorbs the laser energy and is decomposed. When the first semiconductor layer 11 is made of metal nitride (e.g., GaN), it is decomposed to gallium (Ga) and nitrogen (N) gas. With this decomposition reaction, a fine spacing is created between the substrate 10 and the first semiconductor layer 11, and the substrate 10 and the first semiconductor layer 11 are caused to separate from each other.

Irradiation of the laser beam is carried out for the entirety of the wafer as it is executed in plural rounds for each preset region, so that substrate 10 can be removed. By removing the substrate 10 from the first principal surface 15a, it is possible to increase the light output efficiency.

After removal of the substrate 10, the first principal surface 15a is cleaned, and the first principal surface 15a is then roughened to increase the light output efficiency, as needed.

Figure 6B:
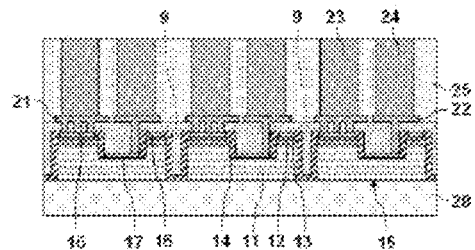

As shown in FIG. 6B, the next step involves the formation of the phosphor layer 28 on the first principal surface 15a of the semiconductor layer 15. In one example, after a liquid transparent resin in which phosphor particles are dispersed (the resin is transparent with respect to the light emitted from the light-emitting layer 12 and the phosphor particles), is coated using the spin coating method, thermal curing is carried out to form the phosphor layer 28.

Figure 6C:
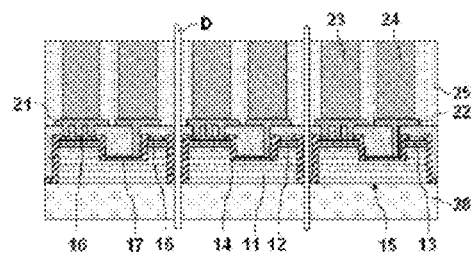

After the formation of the phosphor layer 28, dicing is carried out using a dicing blade D at the position of the separating trenches 9, as shown in FIG. 6C, to form individual pieces. The semiconductor layer 15 is absent in the separating trenches 9; therefore, it is easy to carry out dicing to improve the productivity while avoiding possible damage to the semiconductor layer 15 during dicing. Additionally, after formation of the individual pieces, the structure can be protected as the side surface of the semiconductor layer 15 is covered by the first resin layer 18.

The semiconductor light-emitting device formed as individual pieces may have a single-chip structure containing one semiconductor layer (chip) 15 or may have a multi-chip structure containing plural semiconductor layers (chips) 15.

The various steps of operation carried out before dicing are performed en bloc in the wafer state so that there is no need to carry out electrode re-wiring and packaging for the individual semiconductor light-emitting devices after dicing. As a result, it is possible to significantly reduce the manufacturing costs. That is, for the individual pieces, electrode re-wiring and packaging have been finished. Also, it is possible perform checkup at the wafer level. As a result, productivity can be increased so that it is easy to cut manufacturing costs.

The planar shape of the chip is not limited to the rectangular shape. It may also be a square shape. In addition, the shapes of the p-metal pillar 23 and n-metal pillar 24 are not limited to cylinders, and may be square pillars, columns with an elliptic cross-section, etc.

FIGS. 7A to 9C, FIGS. 10A, and 10B are diagrams illustrating other examples of the layout of the p-electrode 16 and the n-electrode 17. Here, the n-electrode 17 is formed to at least satisfy the relationship of Eqn. (1).

Figure 7A:
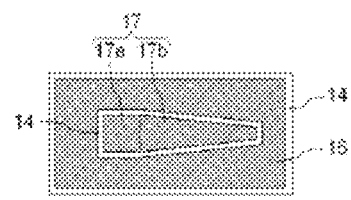
FIGS. 7A to 7D, 8A to 8D, 9A to 9O, and 10A to 10B are schematic plane views illustrating different examples of the shapes and layout of the elements arranged on the second principal surface of the semiconductor light-emitting device according to the first embodiment.

As shown in FIG. 7A, the second portion 17b of the n-electrode 17 is formed to extend along the same direction as the longitudinal direction of the p-electrode 16. Also, the second portion 17b is formed as follows: from the side of the first portion 17a of the n-electrode 17 towards the end portion of the side opposite to the first portion 17a; and with the length E1 in the lateral edge direction of the second portion 17b being narrower gradually.

Figure 7B:
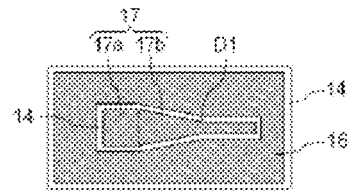

As shown in FIG. 7B, the second portion 17b of the n-electrode 17 is formed to extend along the longitudinal direction of the p-electrode 16. A step D1 is formed in the second portion 17b at an end portion opposite to the first Portion 17a. The length E1 in the lateral direction of the second portion 17b from the first portion 17a towards the step D1 becomes gradually narrower. Next, at the step D1, the length E1 in the lateral direction of the second portion 17b is nearly uniform.

Figure 7C:
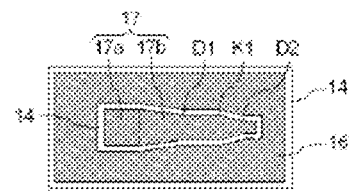

As shown in FIG. 7C, in addition to the structure shown in FIG. 7B, step D2 is formed on the second portion 17b. In this structure, the length E1 in the lateral direction of the second-portion 17b from the first portion 17a of the n-electrode 17 towards the step D1 becomes gradually narrower. From there, the second portion is formed with a nearly constant width until a corner K1; and the length E1 in the lateral direction of the second portion 17b becomes gradually narrower from the corner K1 to a step D2, which is at end portion opposite to the first portion 17a; and, at the step D2, the length E1 in the lateral direction of the second portion 17b is nearly uniform.

Figure 7D:
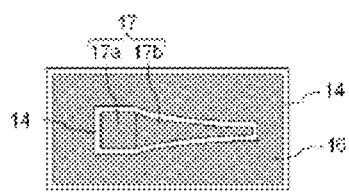

As shown in FIG. 7D, the second portion 17b of the n-electrode 17 is formed from the side of the first portion 17a towards the end portion at the side opposite to the first portion 17a so that the length E1 in the lateral direction of the second portion 17b becomes gradually narrower, in such a manner that the longitudinal edges of the second portion 17b each depict an arc with an inward curvature.

Figure 8A:
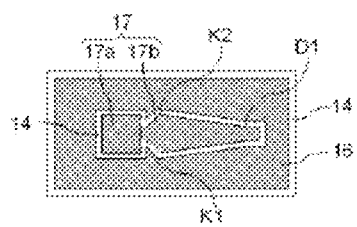

As shown in FIG. 8A, from the first portion 17a of the n-electrode 17 to the end portion on the side opposite to the first portion 17a, the p-electrode 16 protrudes with respect to the lateral direction of the second portion 17b. That is, it is formed so that the length E1 in the lateral direction of the second portion 17b from the first portion 17a to the corner K1 has a nearly constant width, and the length E1 in the lateral direction of the second portion 17b becomes gradually wider from the corner K1 to the corner K2, and becomes gradually narrower from the corner K2 towards the step D1. Additionally, the portion from the step D1 to the end portion on the side opposite to the first portion 17a is formed so that the length E1 in the lateral direction of the second portion 17b has a constant width.

Figure 8B:
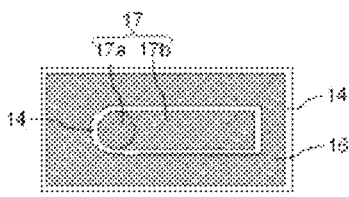
Figure 8C:
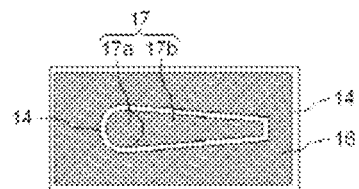
Figure 8D:
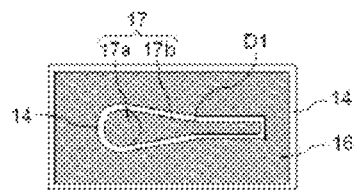
Figure 9A:
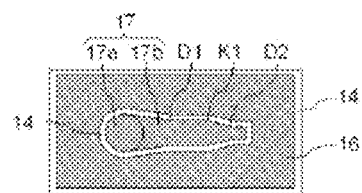
Figure 9B:
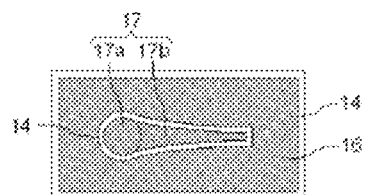
Figure 9C:
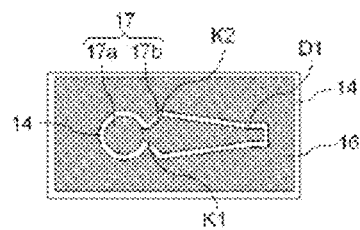

As shown in FIG. 8B, the first portion 17a of the n-electrode 17 is formed as a round shape with curved edges. FIGS. 8O to 9O depict the n-electrode 17 having a round shape with curved edges in place of the quadrangle shape shown in FIGS. 7A to 8A, respectively.

Figure 10A:
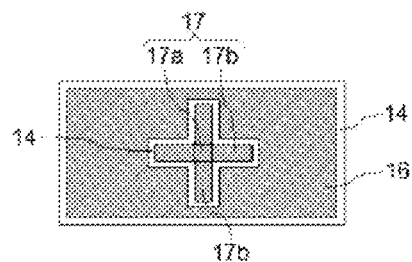
Figure 10B:
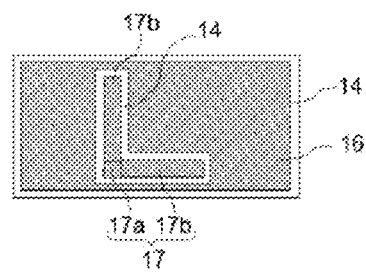

As shown in FIGS. 10A and 10B, plural second portions 17b may be formed to be in contact with the first portion 17a of the n-electrode 17. FIG. 10A depicts the second portion 17b having a cross shape, and FIG. 10B depicts the second portion 17b having an L shape.

Although not shown in the figure, the shape of the first portion 17a is not limited to the quadrangle shape and the round shape; it may have other shapes, such as polygonal shape, curved shape, and shape having both corners and curves.

In all of the examples shown in FIGS. 7A to 9C, FIGS. 10A and 10B, the n-electrode 17 is surrounded by the p-electrode 16. As a result, it is possible to diffuse the current density distribution so that it is easy to disperse the heat on the periphery of the n-electrode 17 generated when the current flows. Additionally, it is possible to have a high current flow, so that it is possible to obtain a semiconductor light-emitting device with a higher efficiency.

Example 2

The following semiconductor light-emitting device according to a second embodiment of the present disclosure will be explained with reference to FIGS. 13A and 13B. The second embodiment differs from the first embodiment in that there are plural n-electrodes each having a first portion and a second portion. The structure of each at these n-electrodes may have the same configurations as described above. Consequently, in the following, the same features as in the first embodiment will not be explained again, and only the differences will be explained.

Figure 13A:
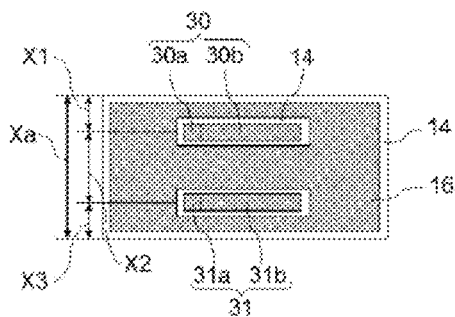
FIGS. 13A and 13B are schematic plane views illustrating shapes and layout of elements arranged on a second principal surface of a semiconductor light-emitting device according to a second embodiment.
Figure 13B:
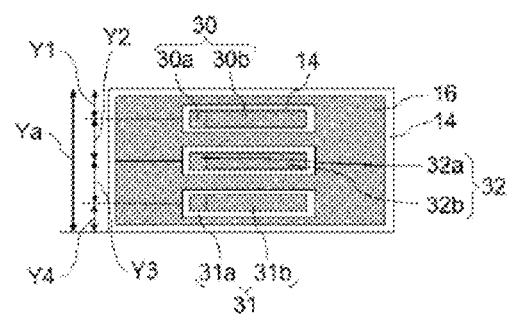

As shown in FIG. 13A, plural n-electrodes 30, 31 are formed and surrounded by the p-electrode 16. While the plural n-electrodes 30, 31 have the first portions 30a, 31a as the regions connected to the n-wiring layer 22, regions 30b, 31b are formed continuous to the first portions 30a, 31a. Next, an insulating layer 14 is formed between the n-electrodes 30, 31 and the p-electrode 16 and to surround the periphery of the p-electrode 16.

The shape of the first portions 30a, 31a is nearly quadrangle. However, the present disclosure is not limited to the quadrangle shape. Any appropriate shape may be used.

The second portions 30b, 31b are arranged in a nearly rectangular shape. As the layout of the p-electrode 16 is nearly rectangular, the longitudinal edges of the second. Portions 30b, 31b extend along the longitudinal direction of the p-electrode 16. In this embodiment the layout has a nearly rectangular shape. However, for the square-shaped semiconductor light-emitting device, the longitudinal edges of the rectangular shape may extend laterally.

Also, the plural n-electrodes 30, 31 are arranged so that there are central axes that go through the first portions 30a, 31a and the second portions 30b, 31b of the n-electrodes 30, 31, respectively, and have linear symmetry (i.e., the lateral direction of the n-electrode has linear symmetry). The central axis is arranged parallel to the longitudinal direction of the n-electrodes 30, 31.

The plural n-electrodes 30, 31 are formed appropriately to meet the following formula (3), where Xa represents the distance between the surface side on the side opposite to the surface side of the insulating layer 14 formed on the side of one side surface of the p-electrode 16 in the longitudinal direction and the surface side opposite to the surface side of the insulating layer 14 formed on the side of the other side surface of the p-electrode 16 in the longitudinal direction; X1 represents the distance between the surface side on the side opposite to the surface side of the insulating layer 14 formed on the side of the side surface of the p-electrode 16 in the longitudinal direction and the central axis of the n-electrode 30; X2 represents the distance between the central axis of the n-electrode 30 and the central axis of the n-electrode 31; and X3 represents the distance between the surface side on the side opposite to the surface side of the insulating layer 14 formed on the side of the other side surface of the p-electrode 16 in the longitudinal direction and the central axis of the n-electrode 31.

$$X2=X1+X3=0.5*Xa \qquad (3)$$

With the this relationship met, it is possible to arranged plural n-electrodes 30, 31 almost equidistantly, allowing for diffusion of the current density on the periphery of the first portions 30a, 31a to the second portions 30b, 31b. Hence, heat generation can be decreased. As a result, it is possible to have more current flow, and light can be emitted at higher luminance.

FIG. 13A the case of two n-electrodes arranged is presented. On the other hand, the case of three n-electrodes arranged will be explained with reference to FIG. 13B.

The n-electrode 32 is arranged between the n-electrodes 30, 31 and is set to be surrounded by the p-electrode 16 via the insulating layer 14. In addition, the n-electrode 32 is parallel to the central axis of the n-electrodes 30, 31.

In this configuration, the n-electrodes 30, 31, 32 are formed so that the following formula (4) is met, where Ye represents the distance between the surface side on the side opposite to the surface side of the insulating layer 14 formed on the side of one side surface of the p-electrode 16 in the longitudinal direction and the surface side opposite to the surface side of the insulating layer 14 formed on the side of the other side surface of the p-electrode 16 in the longitudinal direction; Y1 represents the distance between the surface side on the side opposite to the surface side of the insulating layer 14 formed on the side of one side surface of the p-electrode 16 in the longitudinal direction and the central axis of the n-electrode 30; Y2 represents the distance between the central axis of the n-electrode 30 and the central axis of the n-electrode 32; Y3 represents the distance between the central axis of the n-electrode 32 and the central axis of the n-electrode 31; and Y4 represents the distance between the surface side on the side opposite to the surface side of the insulating layer 14 formed on the side of the other side surface of the p-electrode 16 in the longitudinal direction and the central axis of the n-electrode 31.

$$Y2=Y3=Y1+Y4=(\tfrac{1}{3})*Ya \qquad (4)$$

In this embodiment, the cases of two and three n-electrodes have been explained. However, because there may be more of them, and generalized explanation will be provided. In these cases, the configuration is such that the central axes of the adjacent n-electrodes are arranged equidistantly. The n-electrode arranged on the side surface of the p-electrode 16 in the longitudinal direction should be arranged so that the distance between the side of the surface of the insulating layer 14 formed on the side of the side surface of the p-electrode 16 in the longitudinal direction and the central axis of the n-electrode is half the distance between the central axes of the adjacent n-electrodes.

By making arrangement with the relationship, it is possible to have the plural n-electrodes to be set almost equidistantly. Consequently, the current density distribution of the first portion can be diffused to the second portion, so that it is possible to decrease heat generation. As a result, it is possible to have higher current flow, and thus it is possible to generate light at higher luminance.

Example 3

Figure 14:
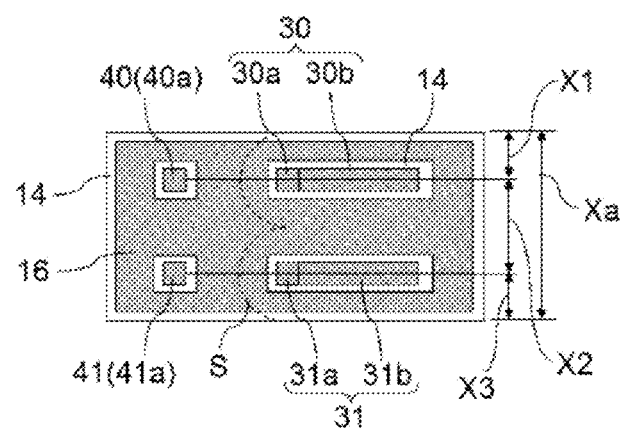
FIG. 14 is a schematic plane view illustrating shapes and layout of elements arranged on a second principal surface of a semiconductor light-emitting device according to a third embodiment.

The following explains the semiconductor light-emitting device related to Embodiment 3 of the present disclosure with reference to FIG. 14. The present embodiment differs from Embodiment 2 in that arrangement of n-electrodes (each made of only the first portion of the n-electrode), while the remaining features of the constitution are the same. Consequently, only the features different from those of Embodiment 2 will be explained in the following.

As shown in FIG. 14, in addition to the plural n-electrodes (first n-electrodes) 30, 31, there are also n-electrodes (second n-electrodes) 40, 41 made of only the first portions 40a, 41a. The n-electrodes 40, 41 are formed on the side where the first portions 30a, 31a of the n-electrodes 30, 31 are formed.

While the n-electrodes 40, 41 have nearly quadrangle shape, any appropriate shape may be adopted.

In this embodiment, the n-electrodes 40, 41 are arranged so that the centers of the n-electrodes 40, 41 are located on the central axes of the n-electrodes 30, 31, respectively. In this embodiment, the configuration is that the centers of the n-electrodes 40, 41 are located along the central axes of the n-electrodes 30, 31, respectively. However, the present disclosure is not limited to the configuration. Any structure may be adopted as long as the central axes are separated from each other by more than a the radius which is defined as the distance between the surface side on the side opposite to the surface side of the insulating layer 14 formed on the side of the side surface of the p-electrode 16 in the longitudinal direction and the center of the first portions 30a, 31a of the n-electrodes 30, 31 (e.g., X1 and X3). In the preferred configuration, the n-electrodes 40, 41 will be symmetric with respect to the central axis of the p-electrode 16 in the lateral direction. In addition, they may be arranged on the side opposite to the second portions 30b, 31b.

Creating this relationship allows for the plural n-electrodes to be set almost equidistantly. Consequently, the current density distribution of the first portion can be diffused to the second portion to decrease heat generation. As a result, higher current flow is possible, and light can be generated at a higher luminance.

In this embodiment, plurality of the n-electrodes with the second portion are arranged, and plurality of the n-electrodes each having only the first portion are arranged. However, other designs can also be adopted, such as a scheme in which the n-electrodes with the second portion and the n-electrodes with the first portion are arranged one by one. Alternately, a scheme in which plurality are arranged for either the n-electrodes with the second portion or the n-electrodes with the first portion may also be adopted.

While certain embodiments have been described, these embodiments have been presented by way of example only and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor light-emitting device comprising:
    a semiconductor layer comprising a first principal surface, a second principal surface formed on a side opposite to the first principal surface, and a light-emitting layer;
    a p-electrode arranged on the second principal surface;
    a plurality of n-electrodes extending in a longitudinal direction of the p-electrode, each arranged on the second principal surface and surrounded by the p-electrode; and
    an insulating layer arranged on side surfaces of the semiconductor layer and on the second principal surface of the semiconductor layer to surround the p-electrode and each of the n-electrodes, wherein
    each of the n-electrode includes a first portion electrically connected to an n-metal pillar and a second portion disposed continuously with the first portion, such that a current flows between the n-metal pillar and the second portion through the first portion, and
    a distance from a longitudinal edge of the p-electrode and a central longitudinal axis of an outermost n-electrode is equal to one-half of a distance between central longitudinal axes of adjacent n-electrodes.

2. The semiconductor light-emitting device according to claim 1, wherein
    each of the n-electrodes further includes,
    a third portion that is disposed separately from the first and second portions and electrically connected to the n-metal pillar.

3. The semiconductor light-emitting device according to claim 2, wherein
    with respect to each of the n-electrodes, a distance from a center of the first portion to a center of the third portion is equal to or greater than a distance from a central longitudinal axis of the second n-electrode and the longitudinal edge of the p-electrode.

4. A semiconductor light-emitting device, comprising:
    a semiconductor layer comprising a first principal surface, a second principal surface formed on a side opposite to the first principal surface, and a light-emitting layer;
    a p-electrode arranged on the second principal surface;
    an n-electrode arranged on the second principal surface and surrounded by the p-electrode; and
    an insulating layer arranged on side surfaces of the semiconductor layer and on the second principal surface of the semiconductor layer to surround the electrode and the n-electrode, wherein
    the n-electrode includes a first portion electrically connected to an n-metal pillar and a second portion disposed continuously with the first portion, such that a current flows between the n-metal pillar and the second portion through the first portion,
    the second portion has a shape having longitudinal edges and lateral edges, and
    an average length of the lateral edges is equal to or greater than 30% of a length of one edge or a diameter of the first portion.

5. The semiconductor light-emitting device according to claim 4, wherein
    a length of one of the lateral edges having a maximum length is equal to or greater than 60% of the length of one edge or the diameter of the first portion.

6. A method of forming a semiconductor light-emitting device, said method comprising:
    forming a semiconductor layer including a first principal surface, a second principal surface on a side opposite to the first principal surface, and a light-emitting layer;
    forming a p-electrode on the second principal surface;
    forming a plurality of n-electrodes extending in a longitudinal direction of the p-electrode on the second principal surface such that each of the n-electrodes is surrounded by the p-electrode;
    forming an insulating layer on side surfaces of the semiconductor layer and on the second principal surface of the semiconductor layer so as to surround the p-electrode and the n-electrode, wherein
    the n-electrode includes a first portion electrically connected to an n-metal pillar and a second portion disposed continuously with the first portion, such that a current flows between the n-metal pillar and the second portion through the first portion, and
    a distance from a longitudinal edge of the p-electrode and a central longitudinal axis of an outermost n-electrode is equal to one-half of a distance between central longitudinal axes of adjacent n-electrodes.

7. The method according to claim 6, wherein each of the n-electrodes further includes,
    a third portion that is disposed separately from the first and second portions and electrically connected to the n-metal pillar.

8. The method according to claim 7, wherein
    with respect to each of the n-electrodes, a distance from a center of the first portion to a center of the third portion is equal to or greater than a distance from a central longitudinal axis of the second n-electrode and the longitudinal edge of the p-electrode.

9. A method of forming a semiconductor light-emitting device, said method comprising:
    forming a semiconductor layer including a first principal surface, a second principal surface on a side opposite to the first, principal surface, and a light-emitting layer;
    forming a p-electrode on the second principal surface;
    forming an n-electrode on the second principal surface so as to be surrounded by the p-electrode;
    forming an insulating layer on side surfaces of the semiconductor layer and on the second principal surface of the semiconductor layer so as to surround the p-electrode and the n-electrode, wherein
    the n-electrode includes a first portion electrically connected to an n-metal pillar and a second portion disposed continuously with the first portion, such that a current flows between the n-metal pillar and the second portion through the first portion,
    the second portion has a shape having longitudinal edges and lateral edges, and
    an average length of the lateral edges is equal to or greater than 30% of a length of one edge or a diameter of the first portion.

10. The method according to claim 9, wherein
    a length of one of the lateral edges having a maximum length is equal to or greater than 60% of the length of one edge or the diameter of the first portion.

* * * * *